(12) United States Patent
Kim

(10) Patent No.: US 7,898,290 B2
(45) Date of Patent: *Mar. 1, 2011

(54) METHOD AND APPARATUS FOR HIGH RESOLUTION ZQ CALIBRATION

(75) Inventor: Kang Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/613,632

(22) Filed: Nov. 6, 2009

(65) Prior Publication Data

US 2010/0045341 A1    Feb. 25, 2010

Related U.S. Application Data

(63) Continuation of application No. 11/299,888, filed on Dec. 12, 2005, now Pat. No. 7,626,416.

(51) Int. Cl.
 H03K 17/16    (2006.01)
 H03K 19/003   (2006.01)
 G11C 11/00    (2006.01)

(52) U.S. Cl. ............ 326/30; 327/108; 365/189.11

(58) Field of Classification Search ............ 326/30, 326/83, 87; 327/108, 333; 365/189.05, 189.11
See application file for complete search history.

(56) References Cited

U.S. PATENT DOCUMENTS

| | | | |
|---|---|---|---|
| 5,254,883 A * | 10/1993 | Horowitz et al. ............ 326/30 |
| 6,262,625 B1 | 7/2001 | Perner et al. | |
| 6,807,650 B2 | 10/2004 | Lamb et al. | |
| 6,836,143 B2 | 12/2004 | Song | |
| 6,839,286 B2 | 1/2005 | Cho et al. | |
| 6,947,336 B2 | 9/2005 | Kim et al. | |
| 6,958,613 B2 | 10/2005 | Braun et al. | |
| 7,362,128 B2 | 4/2008 | Choi et al. | |
| 7,626,416 B2 * | 12/2009 | Kim ............ 326/30 |
| 2002/0063576 A1 | 5/2002 | Kim et al. | |
| 2003/0218914 A1 | 11/2003 | Kim et al. | |
| 2003/0231523 A1 * | 12/2003 | Cho et al. ............ 365/189.05 |
| 2006/0158216 A1 | 7/2006 | Aoyama et al. | |
| 2007/0040573 A1 | 2/2007 | Batt | |
| 2007/0200591 A1 | 8/2007 | Kim | |

* cited by examiner

Primary Examiner—Vibol Tan
Assistant Examiner—Dylan White
(74) Attorney, Agent, or Firm—Dorsey & Whitney LLP

(57) ABSTRACT

A method is disclosed for controlling an output impedance of an electronic device of the type having an impedance control terminal to which an external load is to be connected such that a predetermined value of the voltage at the impedance control terminal controls the output impedance of the device. The method is comprised of comparing a reference voltage to a voltage at the impedance control terminal. A variable count signal representing a count value is produced in response to the comparing. The impedance of a variable impedance circuit is varied in response to the count signal, wherein the impedance of the variable impedance circuit controls the voltage at the impedance control terminal. A device connected in parallel with the variable impedance circuit is periodically operated to change (increase/decrease) the impedance of the variable impedance circuit. An apparatus for performing the method is also disclosed.

23 Claims, 11 Drawing Sheets

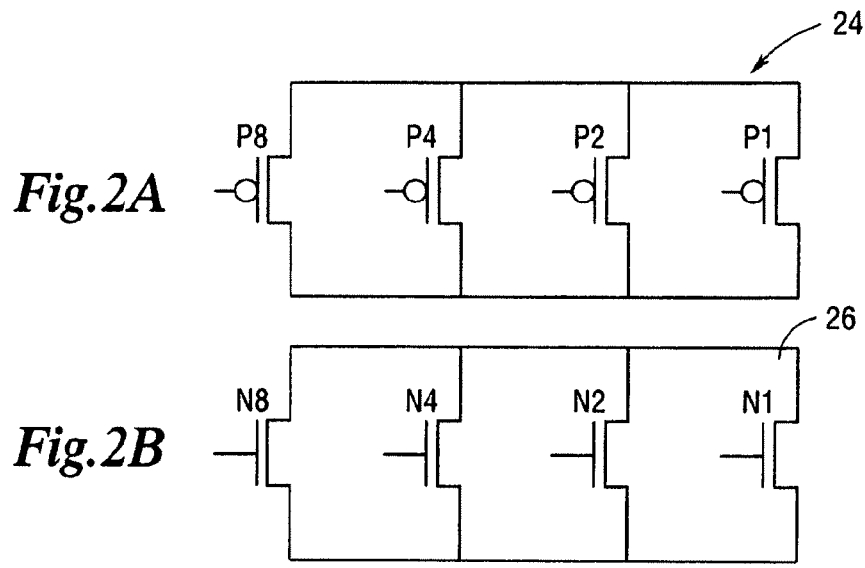
*Fig.2A*
*Fig.2B*
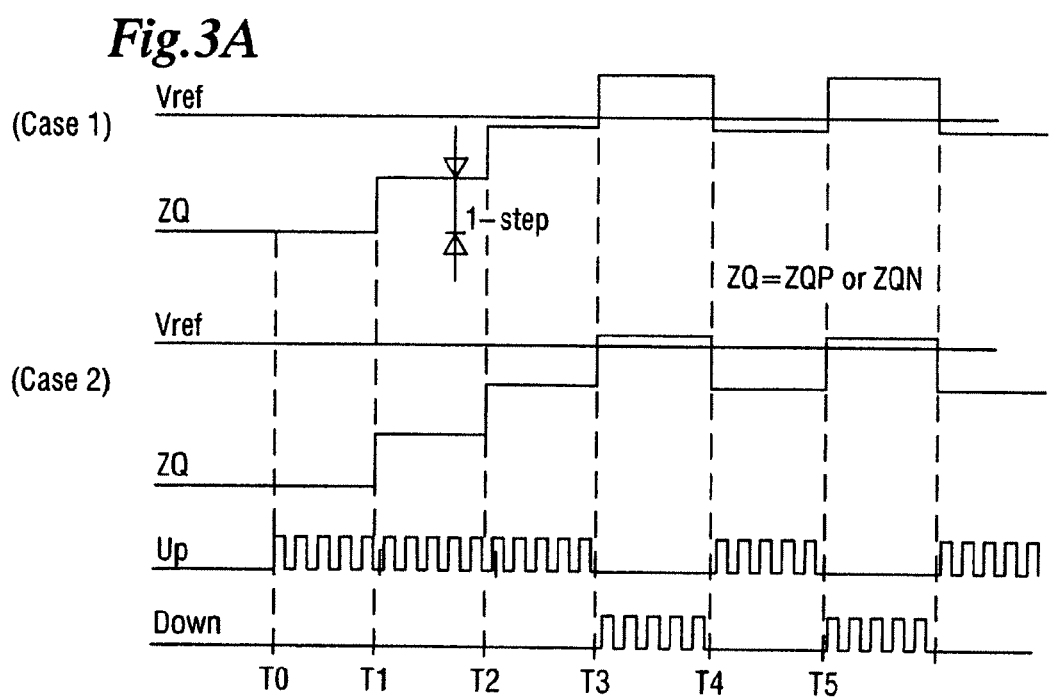
*Fig.3A*
*Fig.3B*

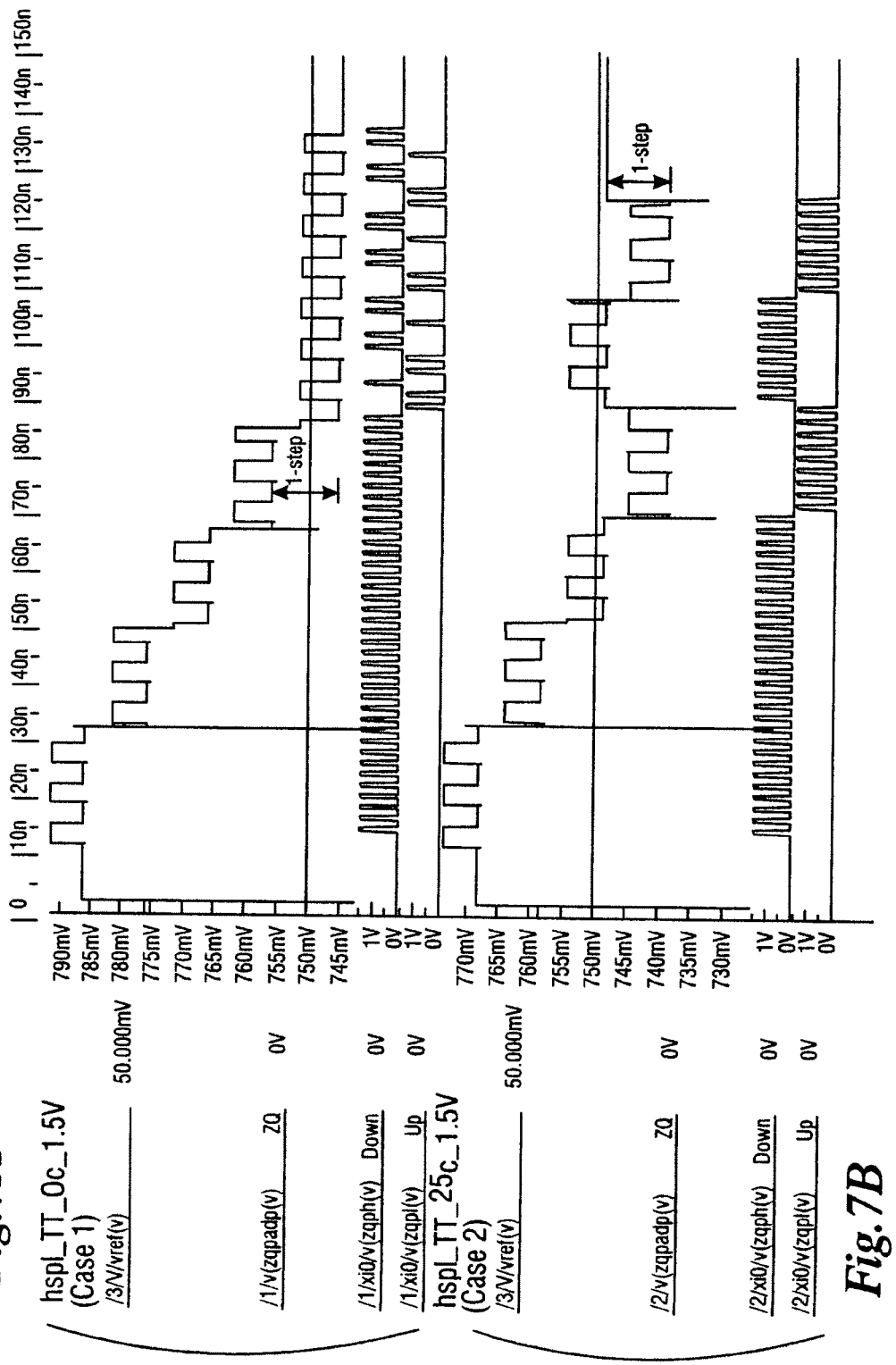

METHOD AND APPARATUS FOR HIGH RESOLUTION ZQ CALIBRATION

CROSS REFERENCE TO RELATED APPLICATIONS

The present application is a continuation of U.S. application Ser. No. 11/299,888 filed Dec. 12, 2005, entitled "Method and Apparatus for High Resolution ZQ Calibration", and issued on Dec. 1, 2009 as U.S. Pat. No. 7,626,416. This application and patent are each incorporated herein by reference for any purpose.

BACKGROUND OF THE INVENTION

The present invention is directed generally to solid state devices and, more particularly, to such devices having a ZQ pad or terminal which may be used to control the output impedance of the device.

Semiconductor devices such as microcomputers, memories, gate arrays, among others, include input/output pins and an output circuit for transmitting data to other devices, via a bus, transmission lines formed on a board, and the like. A circuit within the semiconductor device that is responsible for transmitting data includes, for example, output buffers and drivers. For there to be optimum transmission, the impedance of the transmitting device should be matched to the impedance of the transmission network and receiving device.

As operational speeds of electronic devices increase, the swing of transmitted signals decreases. However, as the signal swing width of a transmitted signal decreases, external noise increases. External noise can affect the reflection characteristics of an output signal if there is an impedance mismatch at an interface. Impedance mismatches are caused by external noise or by noise on a power supply voltage, temperature and process variations, among others. If an impedance mismatch arises, the transmission speed of the data decreases, and the data from a semiconductor device may become distorted. Thus, in a case where a semiconductor device receives distorted data, problems can be caused by setup/hold failures or errors in reading received data.

U.S. Pat. No. 6,947,336 entitled Semiconductor Device With Impedance Control Circuit discloses a semiconductor device with an impedance control circuit capable of automatically obtaining a desired output impedance value irrespective of power supply voltage, temperature, and process variations. Disclosed therein is a semiconductor device that includes an output buffer circuit having a pull-up section comprised of pull-up transistors and a pull-down section comprised of pull-down transistors; a pad connected with an external resistor; and an output impedance control circuit that is connected to the pad and the output buffer circuit and controls an impedance of the output buffer circuit according to an impedance of an external resistor. A first transistor is connected to the pad. A first current source circuit supplies DC current to the pad, and a first-level controller is connected to the pad and controls a gate voltage of the first transistor such that the pad is established at a predetermined voltage. A second transistor is connected to a first internal node and is controlled by the first-level controller. A first variable impedance circuit is connected to the first internal node, and a second current source circuit supplies DC current to the first internal node. A first controller, responsive to a voltage variation of the first internal node, generates a first control code for controlling the first variable impedance circuit so that a voltage of the first internal node is established at the predetermined voltage. A first conversion circuit receives the first control code and converts the control code into a string of data bits. The data bits of the string are transferred in series to the output buffer circuit via a single transmission line.

FIG. 1 illustrates a typical prior art impedance control circuit 10. The impedance control circuit 10 has a ZQ pad or a control pad 12 to which an external resistor 14 may be connected. The value of the voltage at the control pad 12 ($V_{ZQP}$) is input to a comparator 16 along with a reference voltage (Vref) produced by a reference generator 18. The comparator 16 is of the type which produces up and down pulses in response to the difference in magnitude between the values of Vref and $V_{ZQP}$. The up and down pulses are filtered by a filter circuit 20 and input to a counter 22. The counter 22 produces a multi-bit, variable count signal 23 representing a count value which is responsive to the number of up and down pulses which have been counted. The count signal 23 is input to a variable impedance circuit 24. The variable impedance circuit 24 is shown in detail in FIG. 2A.

In FIG. 2A, the variable impedance circuit 24 is comprised of four P-channel MOS transistors connected in parallel. The gate of each of the transistors is responsive to one of the bits of the variable count signal 23. Furthermore, each transistor is twice the size, i.e., has twice the drive, of the previous transistor. Thus, transistor P2 is twice the size of transistor P1; transistor P4 is twice the size of transistor P2; and transistor P8 is twice the size of transistor P4.

In FIGS. 3A and 3B, the voltage Vref is compared to the voltage $V_{ZQ}$. At time T0, the voltage $V_{ZQ}$ is less than the voltage Vref such that a plurality of up pulses is produced. At time T1, a sufficient number of up pulses has been produced so as to change the value of the variable count signal 23 so as to turn on another transistor within the variable impedance circuit 24. For example, transistor P1 may be turned off and transistor P2 turned on, thereby increasing the value of voltage $V_{ZQ}$ by one step. At time T2, the voltage $V_{ZQ}$ is still less than the voltage Vref in both cases, and due to the continued counting of the up pulses, the value of the voltage $V_{ZQ}$ is increased by the other step, e.g., transistor P1 is turned on while transistor P2 remains on. At time T3, the value of $V_{ZQ}$ is increased by another step and now the value of $V_{ZQ}$ exceeds the value of Vref. However, in case 1, the amount of overshoot is greater than the amount of overshoot in case 2. In both cases, however, the value of $V_{ZQ}$ is recognized as greater than value of voltage Vref so that the counter 22 begins to receive down pulses from the comparator 16 for the period shown in the figure from time T3 to time T4. As a result, the value of the variable count signal 23 is returned to the value of that signal at time T2 such that the voltage $V_{ZQ}$ is reduced by one step as shown at time T4. Thereafter, a pattern is developed in which the value of $V_{ZQ}$ is increased by a step for one time period, e.g., time T5 to time T6, and is then reduced by one step. By monitoring the pattern, the count of the variable count signal 23 can be locked at either the value which produces the overshoot as shown from time T3 to time T4 or the value which produces a value for the voltage $V_{ZQ}$ as seen in the time period T4 to T5. After the value for the variable count signal 23 has been locked, a similar process is carried out for a second variable impedance circuit 26 which is comprised of a plurality of N-channel MOS transistors as shown in FIGS. 1 and 2B.

Returning to FIG. 1, the variable impedance circuit 26 is connected in series with a variable impedance circuit 24' which is the same as the variable impedance circuit 24. A voltage $V_{ZQN}$ available at a node between the first variable impedance circuit 24' and the second variable impedance circuit 26 is input to a comparator 28. The output of the comparator 28 is filtered in a filter circuit 30 and input to a second counter 32. The output of the second counter 32 varies the impedance of the variable impedance circuit 26 in a manner similar to that discussed above. When the pattern of up and down pulses becomes stable (repeatable), the value of the count of the variable signal produced by the counter 32 is locked.

Typically, the variable impedance circuit 24 comprised of P-channel MOS transistors is calibrated first via an enable signal input to an enable transistor 34. Similarly, the second variable impedance circuit 26 is calibrated after a second enable transistor 36 is rendered conductive. As seen from the foregoing discussion, and particularly with respect to case 1 of FIG. 3A and case 2 of FIG. 3B, the calibration of $V_{ZQP}$ may have an error substantially equal to one step. Because the calibration of $V_{ZQN}$ is performed after calibration of $V_{ZQP}$, the voltage $V_{ZQN}$ may have a two-step error. A two-step error is a substantial error, particularly for the fast corner.

Accordingly, an improved method and apparatus for ZQ calibration is needed which has high resolution.

SUMMARY OF THE PRESENT DISCLOSURE

According to one embodiment of the present disclosure, a method of controlling an output impedance of an electronic device of the type having an impedance control terminal to which an external load is to be connected is disclosed. In such a device, a predetermined value of the voltage at the impedance control terminal is used to control the output impedance of the device. The method is comprised of comparing a reference voltage to a voltage at the impedance control terminal. A variable count signal representing a count value is produced in response to the comparing. The impedance of a variable impedance circuit is varied in response to the count signal, wherein the impedance of the variable impedance circuit controls the voltage at the impedance control terminal. A device connected in parallel with the variable impedance circuit is periodically operated to periodically change the impedance of the variable impedance circuit.

According to another embodiment of the present disclosure, a method of controlling an output impedance of a memory device having an impedance control terminal to which an external load is to be connected is disclosed. A predetermined value of the voltage at the impedance control terminal is used to control the output impedance of the memory device. The method is comprised of comparing a reference voltage to a voltage at the impedance control terminal. A variable count signal representing a count value is produced in response to the comparing. The impedance of a first variable impedance circuit is varied in response to the count signal, and wherein the impedance of the first variable impedance circuit controls the voltage at the impedance control terminal. A device connected in parallel with the first variable impedance circuit is periodically operated to periodically change the impedance of the first variable impedance circuit. The value of the variable count signal is locked when a predetermined relationship exists between the reference voltage and the voltage at the impedance control terminal. The impedance of a second variable impedance circuit is varied until the impedance of the second variable impedance equals the external impedance.

Varying the impedance of the second variable impedance circuit may be comprised of comparing a voltage available at a node between the first variable impedance circuit and the second variable impedance circuit with the reference voltage. A second variable count signal representing a count value is produced in response to the comparing. The impedance of the second variable impedance circuit is varied in response to the second count signal. A second device connected in parallel with the second variable impedance circuit is periodically operated to periodically change the impedance of the second variable impedance circuit. The value of the second variable count signal is locked when a predetermined relationship exists between the reference voltage and the voltage available at a node between the first variable impedance circuit and the second variable impedance circuit.

Circuits are disclosed for implementing the disclosed methods. The disclosed circuits include a first variable impedance circuit comprised of a plurality of P-channel MOS transistors connected in parallel, and wherein activation of each of the plurality of P-channel MOS transistors is individually controllable based on a bit configuration of the variable count signal. More particularly, the plurality of P-channel MOS transistors includes a first PMOS transistor, a second PMOS transistor connected in parallel with the first PMOS transistor and having twice the size (twice the drive) of the first PMOS transistor, a third PMOS transistor connected in parallel with the first and the second PMOS transistors and having twice the size of the second PMOS transistor, and a fourth PMOS transistor connected in parallel with the first, second, and third PMOS transistors and having twice the size of the third PMOS transistor. The switching device may be implemented by a fifth PMOS transistor connected in parallel with the first, second, third, and fourth PMOS transistors and having half the size of the first PMOS transistor. The gate of the fifth PMOS transistor is configured to receive a driving signal from an oscillator, wherein the driving signal is a periodic pulse train having a predetermined pulse frequency.

The disclosed circuits also include a second variable impedance circuit comprised of a plurality of N-channel MOS transistors connected in parallel, wherein activation of each of the plurality of N-channel MOS transistors is individually controllable based on a bit configuration of the second variable count signal. More particularly, the second plurality of N-channel MOS transistors includes a first NMOS transistor, a second NMOS transistor connected in parallel with the first NMOS transistor and having twice the size of the first NMOS transistor, a third NMOS transistor connected in parallel with the first and second NMOS transistors and having twice the size of the second NMOS transistor, and a fourth NMOS transistor connected in parallel with the first, second, and third NMOS transistors and having twice the size of the third NMOS transistor. The second switching device may be implemented by a fifth NMOS transistor connected in parallel with the first, second, third, and fourth NMOS transistors and having half the size of the first NMOS transistor. The gate of the fifth NMOS transistor is configured to receive a driving signal from an oscillator, wherein the driving signal is a periodic pulse train having a predetermined pulse frequency.

A memory device and a system implementing the disclosed methods and circuits are also disclosed.

BRIEF DESCRIPTION OF THE FIGURES

For the present disclosure to be easily understood and readily practiced, the present disclosure will now be described, for purposes of illustration and not limitation, in conjunction with the following figures, wherein:

FIGS. 2A and 2B are examples of P-type and N-type variable impedance circuits, respectively;

FIGS. 3A and 3B are timing diagrams illustrating when a stable condition occurs in two different cases for the calibration circuit of FIG. 1;

FIGS. 7A and 7B are simulations illustrating two examples of a voltage on the ZQ pad, and the up/down pulses produced as a result of the comparison of the voltage on the ZQ pad with a reference voltage;

DETAILED DESCRIPTION

Figure 1:
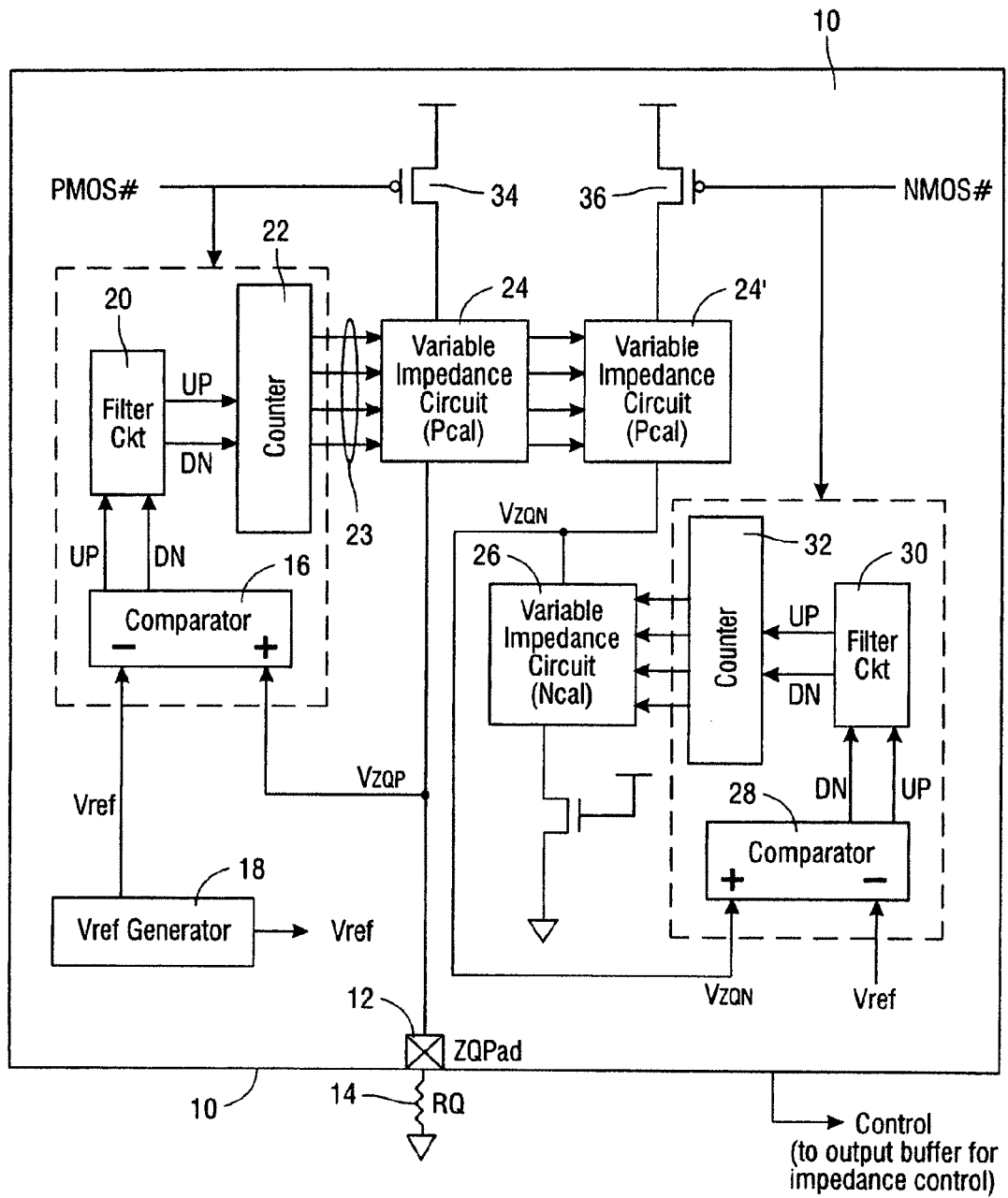
FIG. 1 is a block diagram of a prior art calibration circuit.
Figure 4:
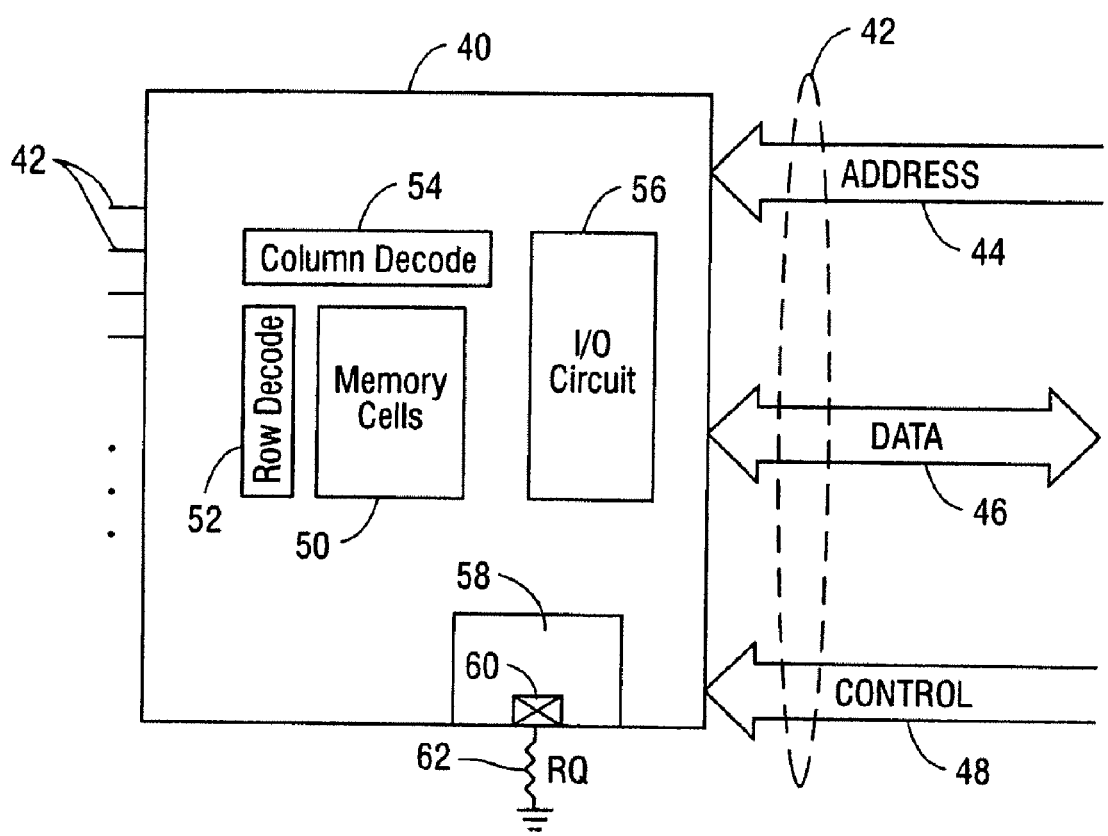
FIG. 4 is a block diagram of a memory device having a calibration circuit constructed according to the teachings of the present disclosure.

FIG. 4 is a simplified block diagram illustrating a memory chip or memory device 40. The memory chip 40 may be part of a DIMM (dual in-line memory module) or a PCB (printed circuit board) containing many such memory chips (not shown in FIG. 4). The memory chip 40 may include a plurality of pins or ball contacts 42 located outside of chip 40 for electrically connecting the chip 40 to other system devices. Some of those pins 42 may constitute memory address pins or address bus 44, data (DQ) pins or data bus 46, and control pins or control bus 48. It is evident that each of the reference numerals 44, 46, 48 designates more than one pin in the corresponding bus. Further, it is understood that the diagram in FIG. 4 is for illustration only. That is, the pin arrangement or configuration in a typical memory chip may not be in the form shown in FIG. 4.

A processor or memory controller (not shown) may communicate with the chip 40 and perform memory read/write operations. The processor and the memory chip 40 may communicate using address signals on the address lines or address bus 44, data signals on the data lines or data bus 46, and control signals (e.g., a row address strobe (RAS) signal, a column address strobe (CAS) signal, a chip select (CS) signal, etc. (not shown)) on the control lines or control bus 48. The "width" (i.e., number of pins) of address, data, and control buses may differ from one memory configuration to another.

The memory chip 40 may include a plurality of memory cells 50 generally arranged in an array of rows and columns. A row decode circuit 52 and a column decode circuit 54 may select the rows and columns, respectively, in the array in response to decoding an address provided on the address bus 44. Data to/from the memory cells 50 are then transferred over the data bus 46 via sense amplifiers and a data output path (not shown). A memory controller (not shown) may provide relevant control signals (not shown) on the control bus 48 to control data communication to and from the memory chip 40 via an I/O (input/output) circuit 56. The I/O circuit 56 may include a number of data output buffers or output drivers to receive the data bits from the memory cells 50 and to provide those data bits or data signals to the corresponding data lines in the data bus 46. The I/O circuit 56 may also include various memory input buffers and control circuits that interact with the row and column decoders 52, 54, respectively, to select the memory cells for data read/write operations.

The memory device 40 also includes an impedance control circuit 58 constructed according to the teachings of the present disclosure. The control circuit 58 is responsive to a ZQ pad or control terminal 60. An external resistor 62 is connectable to the ZQ pad 60 and is used to control the output impedance of the device 40 as described below.

Those of ordinary skill in the art will readily recognize that memory chip 40 of FIG. 4 is simplified to illustrate one embodiment of a memory chip. FIG. 4 is not intended to be a detailed illustration of all of the features of a typical memory chip. Devices such as the row decode circuit 52, column decode circuit 54, and I/O circuit 56 may be considered to be peripheral devices or circuits as they are peripheral to the memory cells 50. Although such peripheral devices are needed to write data to and read data from the memory cells 50, they are not shown in detail in FIG. 4 for the sake of clarity as they are not necessary for understanding the present disclosure.

Figure 5:
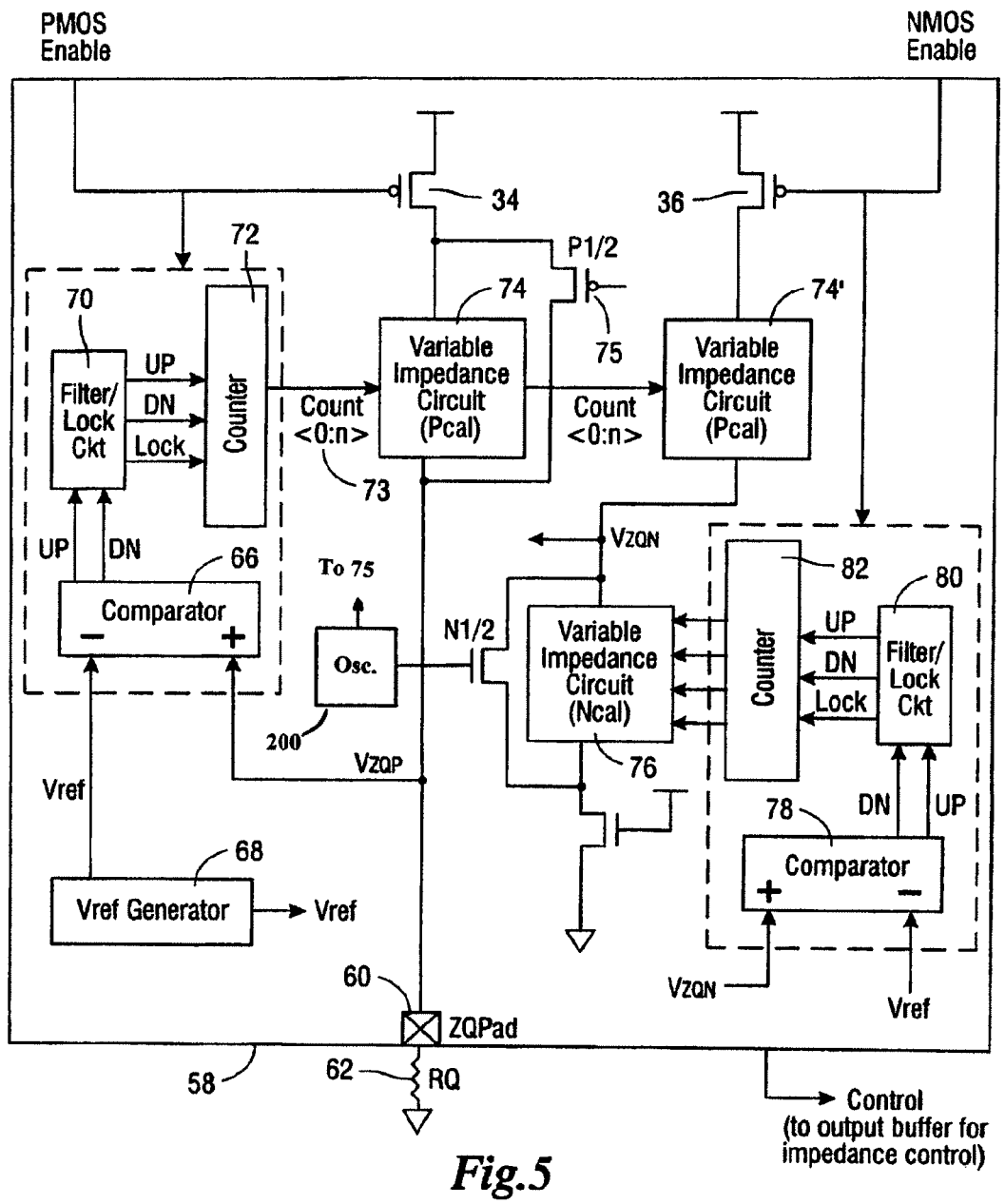
FIG. 5 is a block diagram of a calibration circuit constructed according to the teachings of the present disclosure and which may be used in the memory device of FIG. 4.

FIG. 5 is a block diagram of the calibration circuit 58 constructed according to the teachings of the present disclosure and which may be used in the memory device of FIG. 4. The impedance control circuit 58 has a ZQ pad or a control pad 60 to which an external resistor 62 may be connected. The value of the voltage at the control pad 60 ($V_{ZQP}$) is input to a comparator 66 along with a reference voltage (Vref) produced by a reference generator 68. The comparator 66 is of the type which produces up and down pulses in response to the difference in magnitude between the values of Vref and $V_{ZQP}$. The up and down pulses are filtered by a filter/lock circuit 70 and input to a counter 72. The counter 72 produces a multi-bit, variable count signal 73 representing a count value which is responsive to the number of up and down pulses which have been counted. The count signal 73 is input to a first variable impedance circuit 74 which may be of the type shown in FIG. 2A.

A switching device, in this embodiment a PMOS transistor 75, is connected in parallel with the first variable impedance circuit 74. The switching device 75 is periodically operated (turned on and off). The gate of the transistor 75 may be connected to an oscillator 200 so as to provide the periodic operation. The transistor 75 may be one half the size (i.e., have one half the drive) of the transistor P1 of FIG. 2A. Periodically operating the transistor 75 periodically changes the impedance of the first variable impedance circuit 74. More specifically, when the transistor 75 is conductive, the impedance of the first variable impedance circuit 74 is reduced, and when the transistor 75 is non-conductive, the impedance of the first variable impedance circuit 74 is increased. The frequency of operation of the oscillator is such that the transistor 75 is turned on and off faster than the value of the variable count signal 73 changes, e.g., twice the frequency.

Figure 6A:
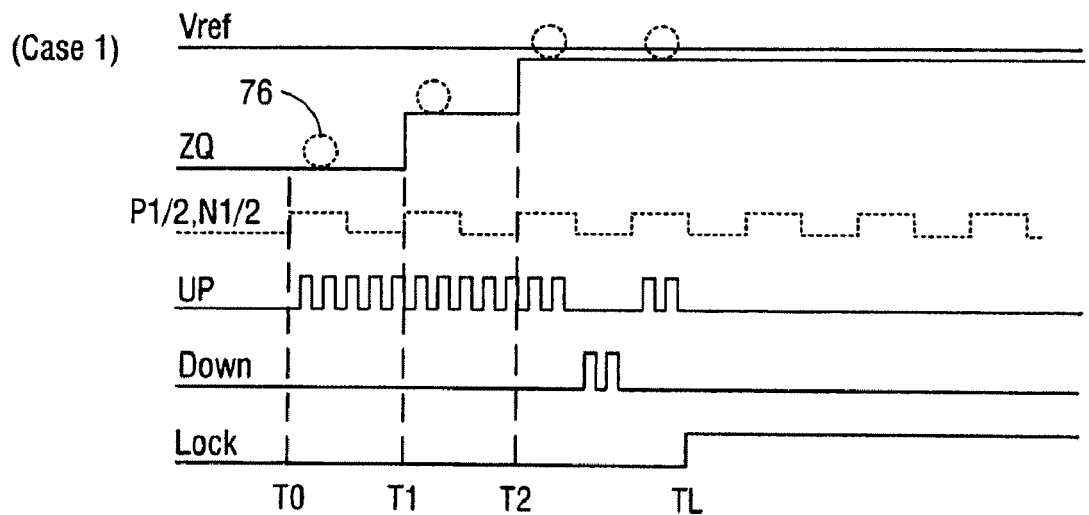
FIGS. 6A and 6B are timing diagrams illustrating when a stable condition occurs and a lock signal is generated for two different cases for the calibration circuit of FIG. 5.
Figure 6B:
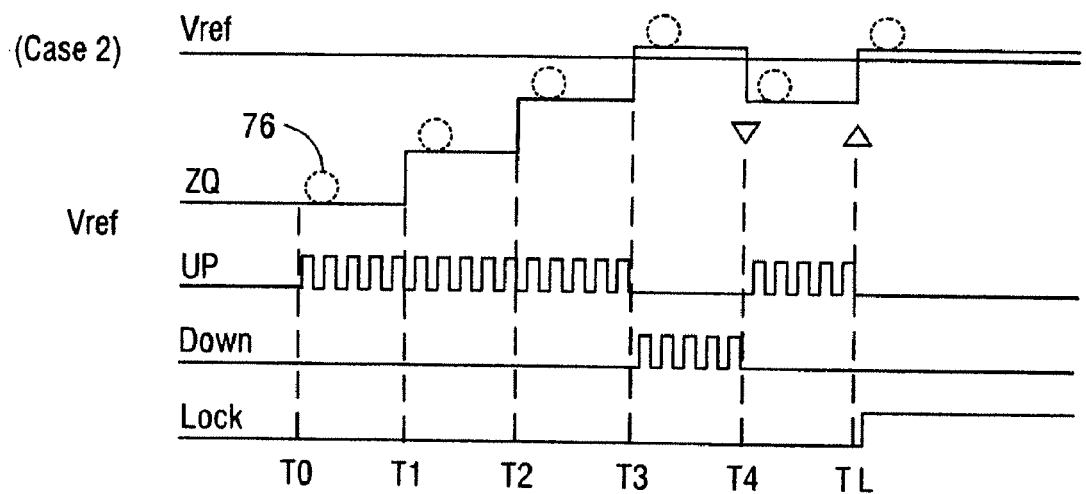

Turning to FIGS. 6A and 6B, the voltage Vref is compared to the voltage $V_{ZQ}$. At time T0, the voltage $V_{ZQ}$ is less than the voltage Vref such that a plurality of up pulses is produced. Also at time T1, the transistor 75 is rendered conductive causing a temporary increase in the voltage $V_{ZQ}$ as shown by the circle 76. However, even with that temporary increase, the value of $V_{ZQ}$ is still less than the value of Vref, so the comparator continues to produce up pulses. At time T1, a sufficient number of up pulses has been produced so as to change the value of the variable count signal 73 so as to turn on another transistor within the variable impedance circuit 24. For example, transistor P1 may be turned off and transistor P2 turned on, thereby increasing the value of voltage $V_{ZQ}$ by one step. Again the transistor 75 is turned on, and again, even with this increase in voltage, the value of $V_{ZQ}$ is still less than the value of Vref. As a result, the comparator continues to produce up pulses. It is not until time T2 in FIG. 6A that the level of $V_{ZQ}$ is such that when transistor 75 is turned on, the increase in voltage is sufficient to enable the value of $V_{ZQ}$ to exceed the value of Vref. Thereafter, the pattern begins to repeat indicating that the value of the variable count signal 73 is stable and may be locked at time TL. As seen in FIG. 6B, the turning on and off of the transistor 75 does not impact the time at which a pattern develops and the time (TL) when the lock signal is produced at time TL. The production of the lock signal is described below in conjunction with FIG. 8.

Comparing the case of FIG. 6A to the case of FIG. 3A, it is seen that the pattern develops sooner, such that the value of the variable count signal 73 may be locked sooner. Comparing the case of FIG. 6B with the case of FIG. 3B, it is seen that if the lock signal is produced at TL as opposed to time T4, a more accurate value is locked. More particularly, in FIG. 6A and FIG. 6B the value of the count of the variable count signal is locked at a point such that there is very little difference between the value $V_{ZQ}$ and the value of Vref. In FIGS. 3A and 3B, there is almost a one-step error between the value of $V_{ZQ}$ and the value of Vref. Thus, it is seen that the method and apparatus of the present disclosure provides for high resolution calibration.

Returning to FIG. 5, a second variable impedance circuit 76 is connected in series with another first variable impedance circuit 74' which is structurally the same as the first variable impedance circuit 74. A voltage available at a node between the another first variable impedance circuit 74' and the second variable impedance circuit 76 is input to a comparator 78. The output of the comparator 78 is filtered in a filter/lock circuit 80 and input to a second counter 82. The output of the second counter 82 varies the impedance of the variable impedance circuit 76 as discussed above. When the pattern of up and down pulses becomes stable (repeatable), the value of the count of the variable signal produced by the counter 82 is locked.

FIGS. 7A and 7B illustrate the results obtained from a simulation of the circuit shown in FIG. 5. It will be understood from FIGS. 7A and 7B that the simulation results are in line with the cases shown in FIGS. 6A and 6B. More specifically, with the operation of the transistor 75, a higher resolution calibration is obtained, and may be obtained more quickly.

Returning to FIG. 5, typically, the variable impedance circuit 74 comprised of P-channel MOS transistors is calibrated first via an enable signal input to the enable transistor 34. Then the second variable impedance circuit 76 is calibrated after the second enable transistor 36 is rendered conductive.

Figure 8:
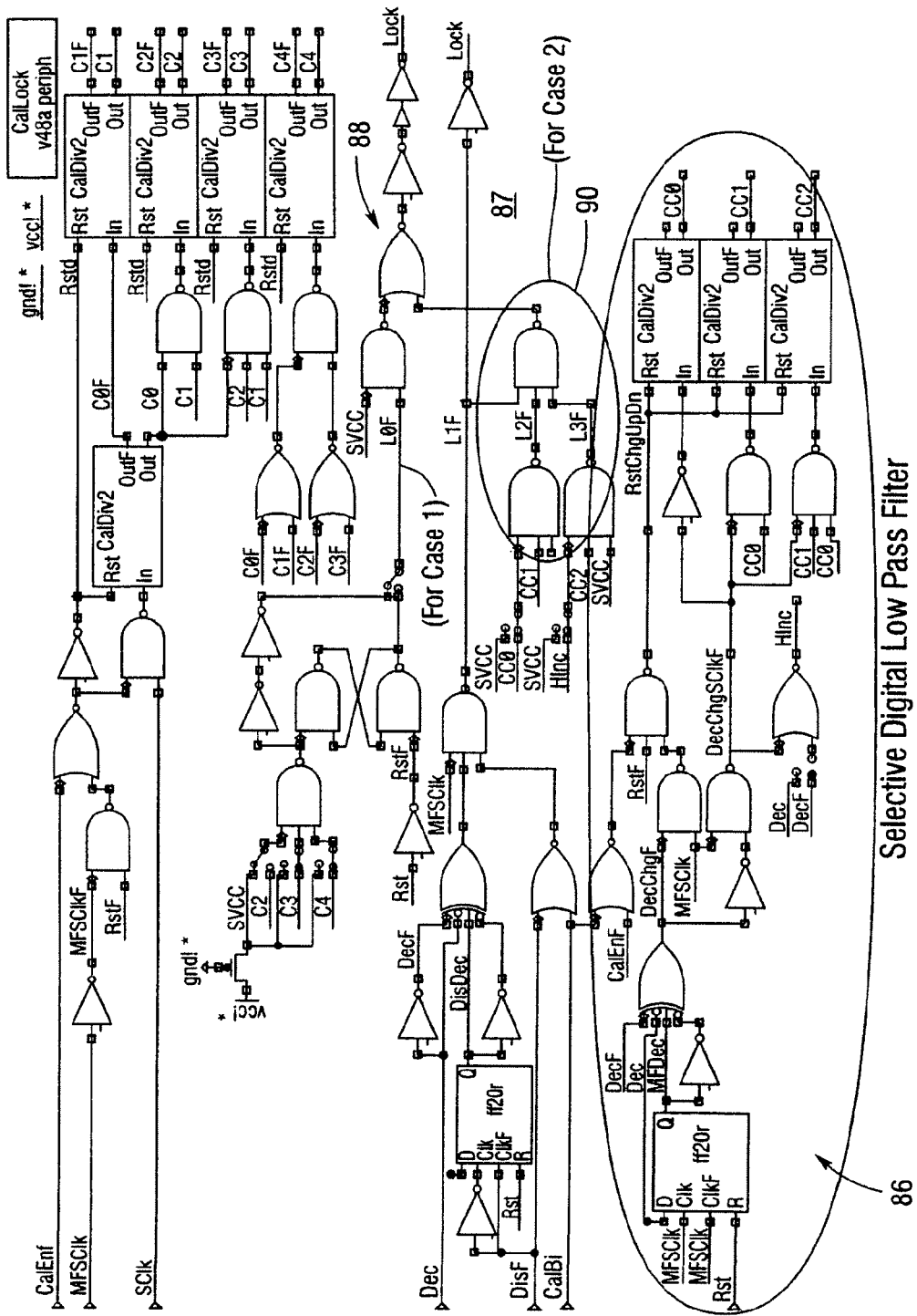
FIG. 8 illustrates one example of a filter/lock circuit which may be used in the calibration circuit disclosed herein.

FIG. 8 illustrates one example of a filter/lock circuit which may be used in the calibration circuit disclosed herein for the filter/lock circuits 70, 80. The bottom portion of the figure illustrates a filter 86 which in this case is a selective, digital, low pass filter. Also disclosed in FIG. 8 is a logic circuit 87 having a first portion 88 capable of monitoring the signals produced by the comparators 66, 78 and recognizing the pattern resulting from case 1 (see FIG. 6A) and a second portion capable of monitoring the signals produced by the comparators 66, 78 and recognizing the pattern resulting from case 2 (see FIG. 6B). In either case, the logic circuit 87 produces a lock signal. Because the filter 86 and logic circuit 87 illustrated in FIG. 8 are merely examples of circuits that may be used to provide the recited functions, and those of ordinary skill in the art will recognize that many other circuit configurations are possible, the circuits of FIG. 8 are not further described herein.

Figure 9:
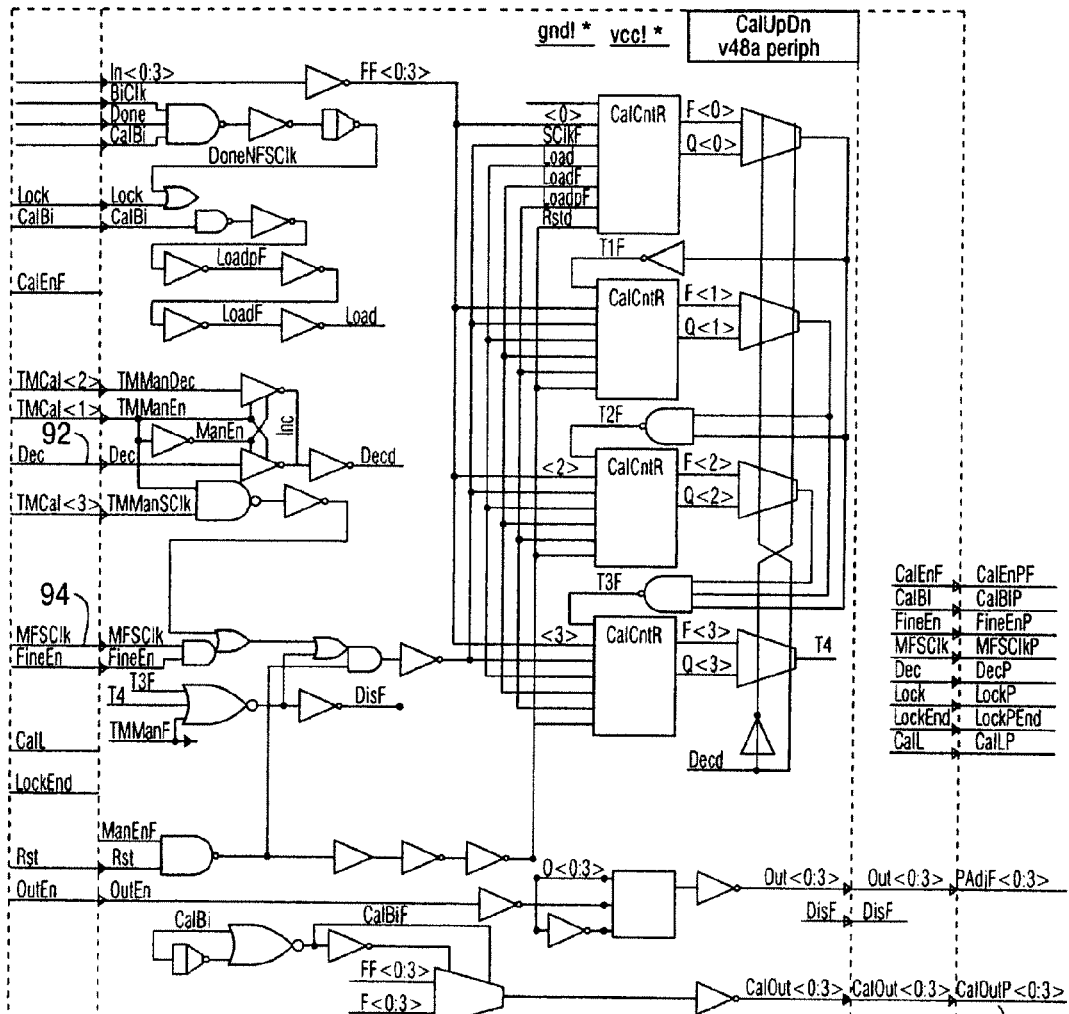
FIG. 9 illustrates one example of an up/down counter which may be used in the calibration circuit disclosed herein.

FIG. 9 illustrates one example of a counter which may be used for the counters 72, 82 of FIG. 5. The counter in FIG. 9 receives signals from the comparator at input terminals 92 and 94 and produces the variable count signal 73 at an output terminal 96. Because the counters 72, 82, illustrated in FIG. 9 are merely one example of a circuit that may be used to provide the recited function, and those of ordinary skill in the art will recognize that many other circuit configurations are possible, the circuit of FIG. 9 is not further described herein.

Figure 10:
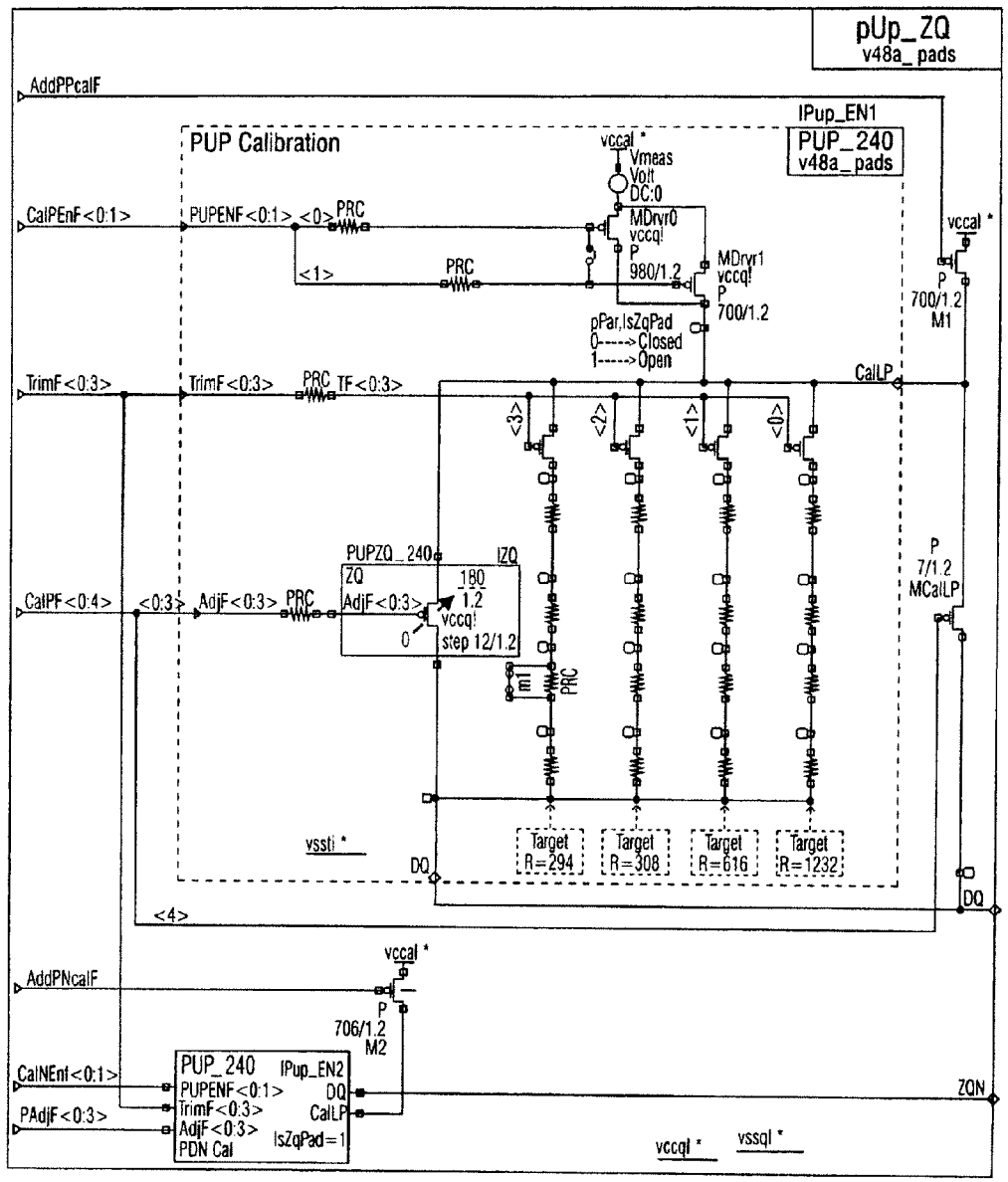
FIG. 10 illustrates one type of a P-type variable impedance circuit which may be used in the calibration circuit disclosed herein.
Figure 11:
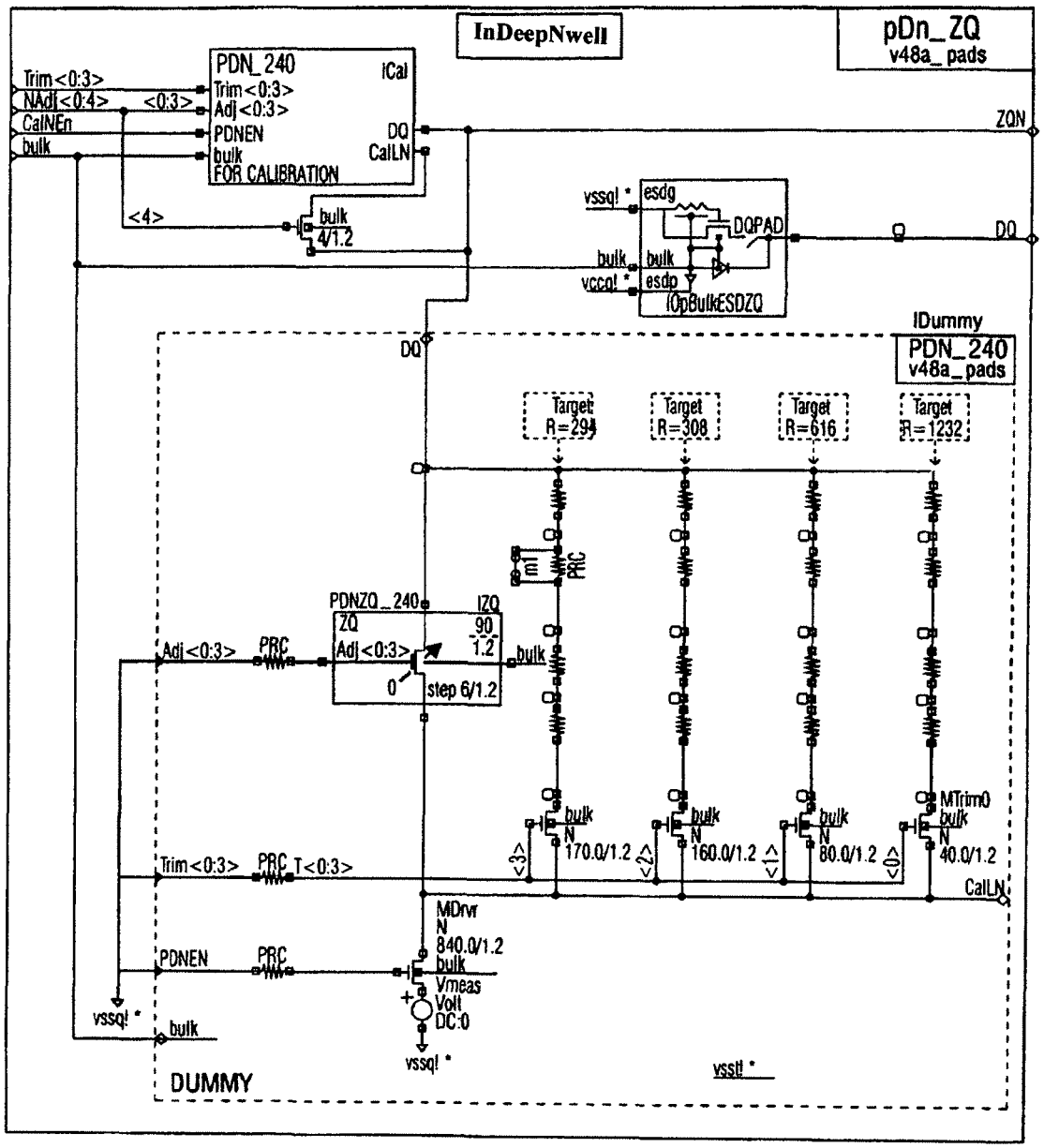
FIG. 11 illustrates one type of an N-type variable impedance circuit which may be used in the calibration circuit disclosed herein.

FIG. 10 illustrates one type of a P-type variable impedance circuit which may be used in the calibration circuit disclosed herein while FIG. 11 illustrates one type of an N-type variable impedance circuit which may be used in the calibration circuit disclosed herein. Each of the circuits shown in FIGS. 10 and 11 is similar to the circuits shown in FIGS. 2A and 2B, respectively, in that each of the circuits is comprised of a plurality of parallel connected transistors.

Figure 12:
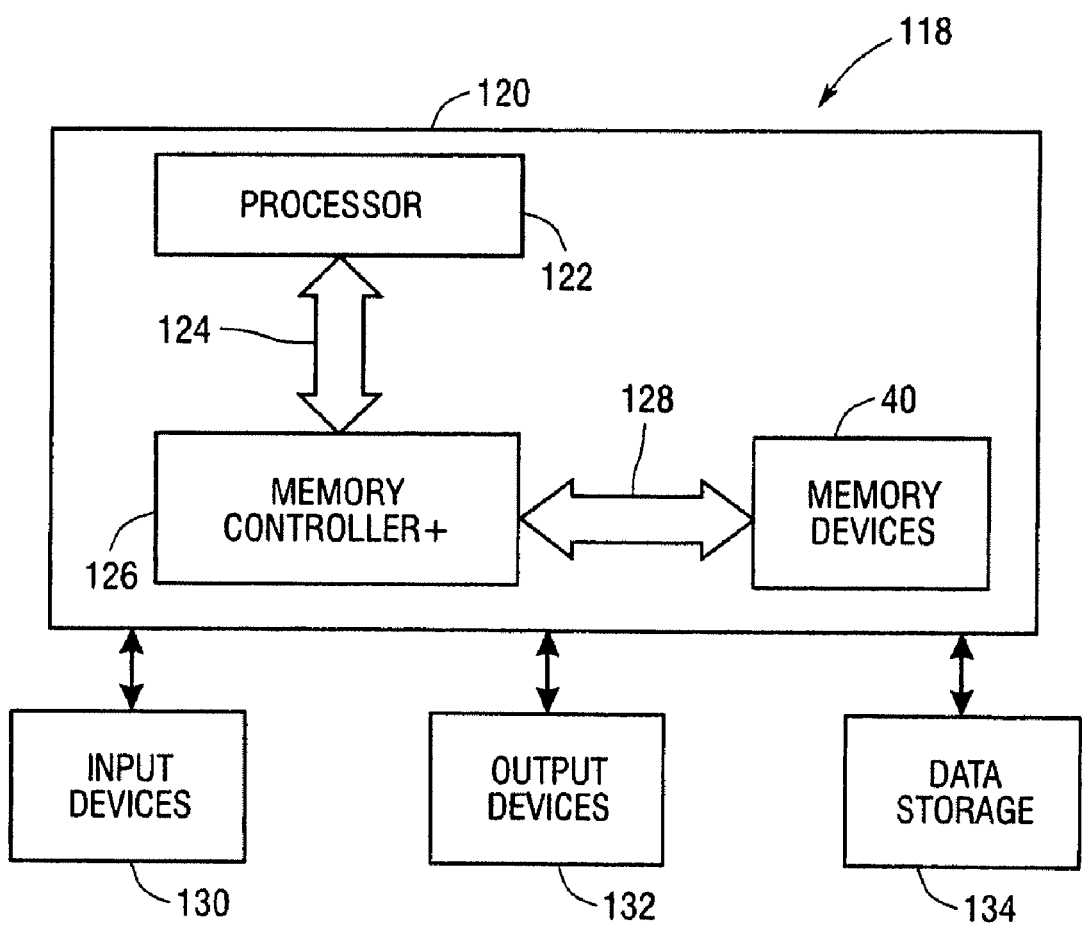
FIG. 12 is a block diagram of a computer system using the memory device of FIG. 4.

FIG. 12 is a block diagram depicting a system 118 in which one or more memory chips 40 illustrated in FIG. 4 may be used. The system 118 may include a data processing unit or computing unit 120 that includes a processor 122 for performing various computing functions, such as executing specific software to perform specific calculations or data processing tasks. The computing unit 120 also includes a memory controller 126 that is in communication with the processor 122 through a bus 124. The bus 124 may include an address bus (not shown), a data bus (not shown), and a control bus (not shown). The memory controller 126 is also in communication with a set of memory devices (i.e., multiple memory chips 40 of the type shown in FIG. 4) through another bus 128 (which may be similar to the bus 42 shown in FIG. 4). Each memory device 40 may include appropriate data storage and retrieval circuitry (not shown in FIG. 12) as shown in FIG. 4. The processor 122 can perform a plurality of functions based on information and data stored in the memories 40.

The memory controller 126 can be a microprocessor, digital signal processor, embedded processor, micro-controller, dedicated memory test chip, a tester platform, or the like. The memory controller 126 may control routine data transfer operations to/from the memories 40, for example, when the memory devices 40 are part of an operational computing system 120. The memory controller 126 may reside on the same motherboard (not shown) as that carrying the memory chips 40. Various other configurations of electrical connection between the memory chips 40 and the memory controller 126 may be possible. For example, the memory controller 126 may be a remote entity communicating with the memory chips 40 via a data transfer or communications network (e.g., a LAN (local area network) of computing devices).

The system 118 may include one or more input devices 130 (e.g., a keyboard or a mouse) connected to the computing unit 120 to allow a user to manually input data, instructions, etc., to operate the computing unit 120. One or more output devices 132 connected to the computing unit 120 may also be provided as part of the system 118 to display or otherwise output data generated by the processor 122. Examples of output devices 132 include printers, video terminals, or video display units (VDUs). In one embodiment, the system 118 also includes one or more data storage devices 134 connected to the data processing unit 120 to allow the processor 122 to store data in or retrieve data from internal or external storage media (not shown). Examples of typical data storage devices 134 include drives that accept hard and floppy disks, CD-ROMs (compact disk read-only memories), and tape cassettes.

It is observed that although the discussion given hereinabove has been primarily with reference to memory devices, it is evident that the impedance calibration circuit discussed hereinbefore with reference to FIGS. 5-11 may be employed, with suitable modifications which will be evident to one skilled in the art, in any other electronic device wherein output impedance may need to be adjusted.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of controlling an output impedance of an electronic device having an impedance control terminal to which an external load is to be connected, said method comprising:
    producing a variable count signal representing a count value;
    varying the impedance of a variable impedance circuit in response to said count signal, wherein the impedance of said variable impedance circuit controls a voltage at said impedance control terminal; and
    operating a device connected in parallel with said variable impedance circuit with an oscillator to periodically change the impedance of said device thereby periodically changing the voltage at said impedance control terminal without requiring a new count value.

2. The method of claim 1 further comprising comparing a reference voltage to said voltage at said impedance control terminal to produce up/down clock pulses, and wherein said producing comprises applying said up/down clock pulses to a counter to produce said variable count signal, wherein said count value varies in relation to said up/down clock pulses.

3. The method of claim 1 wherein said operating comprises periodically decreasing the impedance of said variable impedance circuit thereby periodically increasing the voltage at said impedance control terminal without requiring a new count value.

4. The method of claim 1 further comprising locking said count value of said variable count signal when either:
    a predetermined relationship exists between a reference voltage and said voltage at said impedance control terminal; or
    said variable count signal develops a pattern.

5. The method of claim 1 further comprising:
    locking the value of said variable count signal when a predetermined relationship exists between a reference voltage and said voltage at said impedance control terminal; and
    varying the impedance of a second variable impedance circuit until the impedance of said second variable impedance equals an external impedance.

6. The method of claim 5 wherein said varying the impedance of said second variable impedance circuit comprises;
    comparing a reference voltage with a voltage available at a node between said variable impedance circuit and said second variable impedance circuit;
    producing a second variable count signal representing a count value in response to said comparing;
    varying the impedance of said second variable impedance circuit in response to said second count signal; and
    operating a second device connected in parallel with said second variable impedance circuit with an oscillator.

7. The method of claim 6 further comprising locking the value of said second variable count signal when either:
    a predetermined relationship exists between said reference voltage and said voltage available at said node between said variable impedance circuit and said second variable impedance circuit; and
    said variable count signal develops a pattern.

8. The method of claim 1 wherein the act of periodically changing the impedance of said device comprises periodically changing the impedance of said device in a manner that causes a change in impedance of a parallel combination of the variable impedance circuit and the device to be substantially smaller than the smallest change in the impedance of the parallel combination of said variable impedance circuit and the device responsive to said count signal.

9. A method of controlling an output impedance of a memory device having an impedance control terminal, said method comprising:
    comparing a reference voltage to a voltage at an impedance control terminal;
    producing a first variable count signal representing a count value in response to said comparing;
    varying the impedance of a first variable impedance circuit and another first variable impedance circuit in response to said first variable count signal, wherein the impedance of said first variable impedance circuit controls a voltage at said impedance control terminal;
    operating a device connected in parallel with said first variable impedance circuit to periodically change the impedance of said first variable impedance circuit;
    locking the value of said first variable count signal when a predetermined relationship exists between said reference voltage and said voltage at said impedance control terminal;
    comparing said reference voltage with a voltage available at a node between said another first variable impedance circuit and a second variable impedance circuit;
    producing a second variable count signal representing a count value in response to said comparing;
    varying the impedance of said second variable impedance circuit in response to said second variable count signal;
    operating a second device connected in parallel with said second variable impedance circuit to periodically change the impedance of said second variable impedance circuit; and
    locking the value of said second variable count signal when a predetermined relationship exists between said reference voltage and said voltage available at a node between said another first variable impedance circuit and said second variable impedance circuit.

10. An impedance control circuit for controlling an output impedance of an electronic device having an impedance control terminal, said impedance control circuit comprising:
    a comparator for comparing a reference voltage to a voltage at an impedance control terminal;
    a counter for producing a variable count signal representing a count value in response to said comparator;
    a variable impedance circuit responsive to said variable count signal, the impedance of said variable impedance circuit for controlling the voltage at said impedance control terminal;

an oscillator; and a device connected in parallel with said variable impedance circuit, said device being responsive to said oscillator to periodically change the impedance of the device independently of the variable count signal.

11. The circuit of claim 10 further comprising a logic circuit for producing a lock signal for locking the count value of the count signal when either:

a predetermined relationship exists between said reference voltage and said voltage at said impedance control terminal; or said variable count signal develops a pattern.

12. The circuit of claim 11 wherein said logic circuit further monitors a difference between a periodically increased voltage at said impedance control terminal and a predetermined value so as to determine whether a new variable count signal is required to further vary the impedance of said variable impedance circuit.

13. The circuit of claim 10 wherein said oscillator is operated at a frequency that is twice a frequency of producing a count value.

14. The impedance control circuit of claim 10 wherein the impedance of the device periodically changes responsive to said oscillator in a manner that causes a change in impedance of a parallel combination of the variable impedance circuit and the device to be substantially smaller than the smallest change in the impedance of the parallel combination of said variable impedance circuit and the device responsive to said variable count signal.

15. An impedance control circuit for controlling an output impedance of a memory device having an impedance control terminal, said impedance control circuit comprising:

a first variable impedance circuit;

another first variable impedance circuit;

circuitry for producing a first variable count signal for varying the impedance of said first and said another first variable impedance circuits, wherein the impedance of said first variable impedance circuit controls a voltage at an impedance control terminal;

an oscillator;

a device connected in parallel with said first variable impedance circuit, said device being responsive to said oscillator to periodically change the impedance of the device independently of the first variable count signal;

a first logic circuit for producing a lock signal for locking a value of said variable count signal when a predetermined relationship exists between a reference voltage and said voltage at said impedance control terminal;

a second variable impedance circuit connected in series with said another first variable impedance circuit;

circuitry for producing a second variable count signal for varying the impedance of said second variable impedance circuit; and a second logic circuit for producing a lock signal for locking a value of said second variable count signal when a predetermined relationship exists between a reference voltage and a voltage at a node connecting said another first variable impedance circuit and said second variable impedance circuit.

16. The circuit of claim 15 wherein said first variable impedance circuit and said another first variable impedance circuit are each comprised of a plurality of P-channel transistors connected in parallel, and wherein activation of each of said plurality of P-channel transistors is individually controllable based on a bit configuration in said first variable count signal.

17. The circuit of claim 16 wherein said plurality of P-channel transistors includes:

a first transistor;

a second transistor connected in parallel with said first transistor and having twice the size of said first transistor;

a third transistor connected in parallel with said first and said second transistors and having twice the size of said second transistor; and a fourth transistor connected in parallel with said first, second, and third transistors and having twice the size of said third transistor, and wherein said device connected in parallel with said first variable impedance circuit is a fifth P-channel transistor connected in parallel with said first, second, third, and fourth transistors and having half the size of said first transistor, a gate of said fifth transistor is responsive to said oscillator.

18. The circuit of claim 15 additionally comprising:

a device connected in parallel with said second variable impedance circuit, said device being responsive to said oscillator to periodically change the impedance of the device connected in parallel with said second variable impedance circuit independently of the second variable count signal.

19. The circuit of claim 18 wherein said second variable impedance circuit comprises a plurality of N-channel transistors connected in parallel, wherein activation of each of said plurality of N-channel is individually controllable based on a bit configuration in said second variable count signal.

20. The circuit of claim 19 wherein said plurality of N-channel transistors includes:

a first transistor;

a second transistor connected in parallel with said first transistor and having twice the size of said first transistor;

a third transistor connected in parallel with said first and said second transistors and having twice the size of said second transistor; and a fourth transistor connected in parallel with said first, second, and third transistors and having twice the size of said third NMOS transistor, and wherein said device connected in parallel with said second variable impedance circuit is a fifth N-channel transistor connected in parallel with said first, second, third, and fourth transistors and having half the size of said first transistor, a gate of said fifth transistor is responsive to said oscillator.

21. The circuit of claim 15 wherein said circuitry for producing said first variable count signal comprises:

a first comparator for comparing a reference voltage to said voltage at said impedance control terminal; and a first counter responsive to said first comparator for producing said first variable count signal.

22. The circuit of claim 15 wherein said circuitry for producing said second variable count signal comprises:

a second comparator for comparing a reference voltage with a voltage available at a node between said another first variable impedance circuit and said second variable impedance circuit; and a second counter responsive to said second comparator for producing said second variable count signal.

23. The impedance control circuit of claim 15 wherein the impedance of the device periodically changes responsive to said oscillator in a manner that causes a change in impedance of a parallel combination of the variable impedance circuit and the device to be substantially smaller than the smallest change in the impedance of the parallel combination of said first variable impedance circuit and the device.

* * * * *